United States Patent [19]

Valdettaro

[11] 4,037,482
[45] July 26, 1977

[54] ACCURATE UHF TELEVISION TUNING SYSTEM AND METHOD OF FABRICATING SAME

[75] Inventor: Alarico A. Valdettaro, Bloomington, Ind.

[73] Assignee: Sarkes Tarzian, Inc., Bloomington, Ind.

[21] Appl. No.: 577,062

[22] Filed: May 13, 1975

[51] Int. Cl.² ............................................. F16h 35/18
[52] U.S. Cl. .................................. 74/10.41; 74/10.54; 334/84; 361/298
[58] Field of Search ................. 74/10.41, 10.15, 10.54, 74/527; 334/82, 3, 84, 88; 317/253

[56] References Cited

U.S. PATENT DOCUMENTS

| | | | |
|---|---|---|---|
| 2,594,667 | 4/1952 | Lytle et al. | 74/10.41 |
| 2,751,560 | 6/1956 | Brinker | 334/83 |
| 3,013,231 | 12/1961 | Meadows et al. | 74/10.41 |
| 3,477,299 | 11/1969 | Speer et al. | 74/10.41 |
| 3,702,958 | 11/1972 | Reynolds | 317/253 |
| 3,739,244 | 6/1973 | Tatsumi | 317/253 |
| 3,774,459 | 11/1973 | Valdettaro | 74/10.41 |

*Primary Examiner*—Samuel Scott
*Assistant Examiner*—Randall Heald

*Attorney, Agent, or Firm*—Mason, Kolehmainen, Rathburn & Wyss

[57] ABSTRACT

A highly accurate UHF television tuner utilizes an improved housing and an improved mounting system for securing the tuning rotor and stator within the housing. The housing is fabricated from sheet metal that is welded at the corners to provide mechanical rigidity, and soldered at the corners to provide a good electrical contact. A cover is placed over an open end of the housing and soldered at the corners further to increase the mechanical rigidity of the housing. The depth of the housing is increased to reduce the effects of the housing on the tuner elements. An eyelet is mounted in one end of the housing for supporting the rotor shaft, and the stator is mounted by insulating posts that are inserted through sleeves integrally formed in the housing. An improved contact for more effectively grounding the rotor shaft to the housing is provided, and an improved detenting system is provided for the selector shaft to reduce the effects of inertial creep. An improved method is provided for mounting the rotor plates to the rotor shaft and for mounting the stator plates to the housing to improve the accuracy of alignment between the rotor and stator plates.

18 Claims, 12 Drawing Figures

ACCURATE UHF TELEVISION TUNING SYSTEM AND METHOD OF FABRICATING SAME

BACKGROUND OF THE INVENTION

This invention relates generally to tuners, and more particularly, to extremely accurate detented type UHF television tuners.

Detented type UHF television tuners utilizing a detented selector shaft which drives a continuously variable main tuning shaft by means of a speed reducing gear mechanism are well known. Such tuners have reached a high degree of refinement, with the more sophisticated ones of the tuners having a separate detent position for each of the seventy UHF channels that can be received and a digital dial mechanism that provides a precise nonambiguous indication of the number of the channel being received. In such UHF television tuners, the various components of the detenting mechanism and the gear mechanism must be fabricated with a high degree of precision to assure that the number of the channel actually received by the tuner corresponds to the number indicated by the dial mechanism.

One seventy-position UHF tuner is described in U.S. Pat. No. 3,842,683 issued to Alarico A. Valdettaro, and incorporated herein by reference. The UHF tuner described in the above-referenced Valdettaro patent is a 70-position detented type UHF tuner that has been designed to provide a tuning accuracy of approximately ±3 megacycles. Because the channel spacing between adjacent television channel allocations is six megacycles, such a tuner is sufficiently accurate to be usable with an indicator dial providing a unique read out for each television channel, particularly when employed with an associated AFC control circuit.

Recently, in accordance with its policy of requiring the operation of UHF and VHF television tuners to be alike, the Federal Communications Commission issued a ruling requiring that all detented type UHF television tuners have a tuning accuracy of ±1 megacycle over a seventy channel UHF range. Accordingly, there is a great need at this time to provide a commercially feasible UHF television tuner that complies with the recent FCC rulings.

It is, therefore, an object of the present invention to provide a new and improved UHF tuner arrangement which avoids one or more of the above-discussed disadvantages of the prior art arrangements.

It is another object of the present invention to provide a detented UHF tuner arrangement that provides greater tuning accuracy than tuners heretofore developed.

It is a further object of the present invention to provide a UHF television tuner that has a tuning accuracy of ±1 megacycle over the entire UHF range.

It is yet another object of the present invention to provide a highly accurate UHF television tuner that can be manufactured at a cost comparable to that of presently manufactured UHF tuners.

Briefly, in accordance with a preferred embodiment of the invention, the range of rotation of the main tuning shaft is increased from a nominal 180° to a nominal 270°; for example, 276°. This permits a 4° spacing between each of the 70 UHF television channels (69 spaces between 70 channels). This provides the dual advantages of reducing the amount of error in capacitance occurring as a result of a given error in position, and further reduces the errors introduced by the speed reducing drive mechanism by reducing the reduction ratio and consequently the number of gears necessary to achieve that lower reduction ratio.

Other factors such as wear, temperature variations and aging also serve to reduce the accuracy of a tuner. Accordingly, the housing of the tuner is rigidized by spot welding its corners. The corners are also soldered to provide a better electrical connection between adjacent sides of the housing than can be achieved by spot welding alone. The housing is provided with a cover that is also soldered at the corners further to increase the rigidity of the unit, and the depth of the housing is increased to reduce the effects of the cover on the electrical characteristics of the tuner.

The accuracy with which the tuning capacitor rotor is positioned with respect to the stator also determines the accuracy of the tuner. Accordingly, an improved bearing surface is provided for the end of the rotor shaft to improve the accuracy of the positioning of the rotor shaft and to reduce wear on the rotor shaft that causes the rotor blades to shift with respect to the stator blades during the life of the tuner. An improved stator mounting arrangement is provided to eliminate the shift in the position of the stator blades that can occur with time with conventional mounting techniques. An improved method for mounting the rotor plates on the rotor shaft is provided to permit the rotor plates to be more accurately positioned with respect to the stator plates, and an improved contact is provided between the rotor shaft and the tuner housing to provide a more effective grounding of the rotor shaft to further improve the accuracy of the tuner.

In addition to the factors described above, mechanical phenomena occurring in the drive train can contribute to the inaccuracies of the tuner. One such phenomenon is known as inertial creep. Inertial creep occurs in detent type tuners that have a main tuning shaft that is operated by means of a detented selector shaft and a continuously variable fine tuning shaft. In such tuners, the fine tuning shaft is coupled to the detented selector shaft by means of a clutch or the like, and the acceleration and deceleration of the detented selector shaft caused by the channel selection operation can cause a sufficient slippage of the clutch that interconnects the selector shaft and the fine tuning shaft to detune the tuner enough to require the user to periodically readjust the fine tuning. Accordingly, in accordance with an important feature of the invention, an improved detenting mechanism is provided for reducing the acceleration of the selector shaft caused by the detenting mechanism to thereby reduce the inertial loads on the clutch interconnecting the selector shaft and the fine tuning shaft to thereby substantially reduce the amount of inertial creep produced.

DETAILED DESCRIPTION OF THE INVENTION

Figure 1:
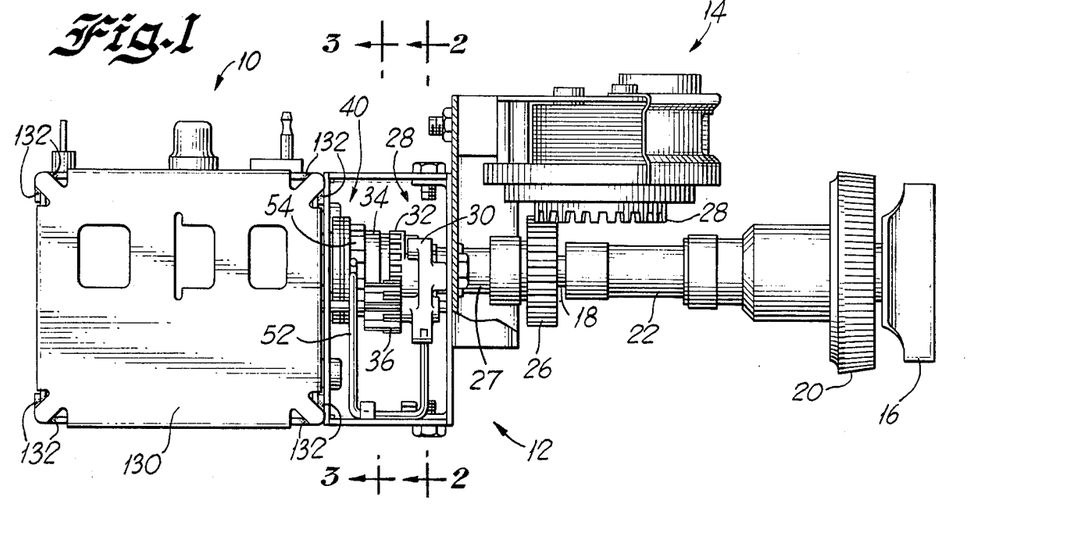
FIG. 1 is a side elevation view of a highly accurate UHF tuning system according to the invention.

Referring now to the drawings, with particular attention to FIG. 1, the accurate UHF television tuning system according to the invention includes a highly accurate UHF tuner 10, a detented drive mechanism 12, and an indicator dial 14 that provides a unique indication for each of the seventy UHF television channels in the UHF television band. The indicator dial 14 illustrated in FIG. 1 is similar to the indicator described in United States patent application Ser. No. 257,846 filed May 30, 1972 by Alarico A. Valdettaro, assigned to the same assignee as the assignee of the present invention and incorporated herein by reference. Although a particular indicator dial 14 is illustrated in FIG. 1, any suitable indicator dial may be used. One such indicator usable with the tuning system according to the invention is described in the previously referenced U.S. Pat. No. 3,842,683.

Figure 2:
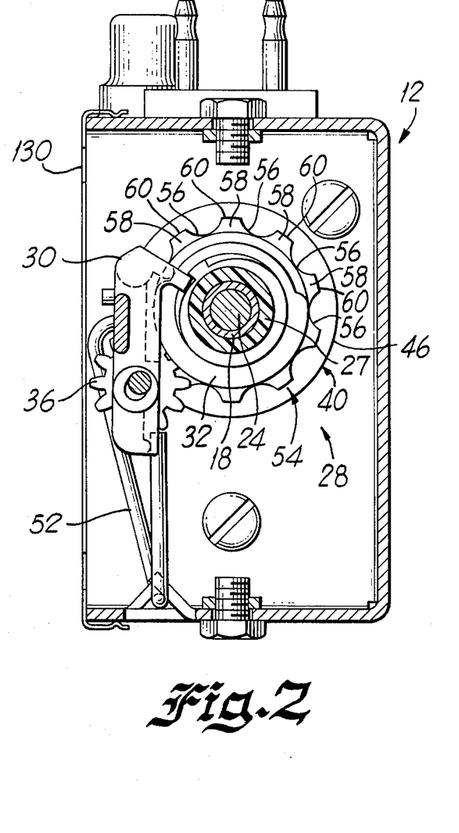
FIG. 2 is a front sectional view of the tuning system taken along line 2—2 of FIG. 1.

Tuning of the UHF tuner 10 is effected by a station selector knob 16 that is affixed to a selector shaft 18 (FIGS. 1 and 2), and fine tuning is effected by means of a fine tuning knob 20 affixed to an external fine tuning shaft 22 which is mechanically coupled to a central fine tuning shaft 24 by means of a radially extending pin (not shown) similar to the pin 280 illustrated in FIG. 18 of the referenced U.S. Pat. No. 3,842,683. An indicator driving gear 26 is affixed to a shaft 27 which rotates with the selector shaft 18 and serves to drive a crown gear 28 of the indicator unit 14 and causes the indicator unit 14 to display a unique number for each of the seventy UHF channels to which the tuner 10 may be tuned.

The detented drive mechanism 12 utilizes a turn-limiting device 28 having a pawl 30 for engaging a gear 32 in a Geneva mechanism also comprising a single toothed gear 34 affixed to the shaft 27 and an idler gear 36. The stop mechanism serves to limit the rotation of the selector shaft 18 to a range of rotation sufficient to cover the seventy UHF channels, in the present embodiment approximately 6.9 revolutions. The turn limiting device 28 is similar to the stop mechanism described in U.S. Pat. No. 3,774,459 issued Nov. 27, 1973 to Alarico A. Valdettaro, assigned to the same assignee as the assignee of the present invention, and incorporated herein by reference.

Rotational motion from the selector shaft 18 and the central fine tuning shaft 24 is transmitted to a rotor shaft 38 (FIGS. 4-8) within the tuner 10 by means of a clutch mechanism 40 and a pair of gears 42 and 44. When a station is selected by means of the station selector knob 16, the selector shaft 18 is rotated by the knob 16 and causes a driving plate 46 of the clutch assembly 40 to rotate. Rotational motion is transferred from the driving plate 46 to a driven plate 48 by means of a clutch plate 50. The driven plate 50 is attached to the driving gear 42 and causes the gears 42 and 44 to rotate, thereby effecting rotation of the rotor shaft 38. In the embodiment shown, the ratio of the gears 42 and 44 is approximately 9-to-1 to provide approximately 276° of rotation of the rotor shaft 38 when the selector shaft 18 is rotated over its entire range of approximately 6.9 revolutions.

Fine tuning is effected by rotating the fine tuning knob 20, which in turn causes the outer fine tuning shaft 22 to rotate. Rotary motion is then transferred to the central tuning shaft 24 by means of a pin (not shown) similar to the previously mentioned pin 280 of the referenced U.S. Pat. No. 3,842,683 and then transferred to the gear 42 which is affixed to the central fine tuning shaft 24. During the fine tuning operation, the driving plate 46 is held stationary by a detenting mechanism comprising a resiliently biased member, in this embodiment, a spring 52 that engages a detent wheel 54 that is affixed to the selector shaft 18. In the embodiment shown, the detent wheel 54 is integrally formed with the driving plate 46 and the single toothed gear 34, however, these components may be individually fabricated and separately affixed to the selector shaft 18.

Because the driving plate 46 is held stationary during the fine tuning operation, the clutch assembly 40 must be designed to permit slippage between the plates 46, 48 and 50 during the fine tuning operation, and must be designed for minimal slippage during the channel selection operation when the tuner 10 is being tuned by the selector shaft 18.

The necessity to provide slippage in the clutch assembly 40 to accommodate the fine tuning operation results in a phenomenon known as "inertial creep" which causes undesired relative movement between the plates 46 and 48 during the channel selecting process. This repositioning of the plates 46 and 48 during the channel changing process causes the setting of the fine tuning to be disturbed. Consequently, after the tuner has been returned to different channels a number of times, the fine tuning must be readjusted because the shift in the relative position of the plates 46 and 48 causes the gear 42, and hence the rotor shaft 38 to assume a different position relative to the position of the selector shaft as determined by the detent wheel 54.

It has been found that one of the causes of inertial creep is the rapid acceleration and deceleration of the drive mechanism 12 by the detenting mechanism. Typical prior art detenting wheels are star-shaped and have rather long, sloping teeth between the indentations defining the detent positions. When such a detenting mechanism is moved between detent positions, the rotation of the detent wheel raises the detenting member against its resilient biasing force until the peak of one of the teeth of the detenting wheel is reached. At this point, the biasing action of the detent member, which generally exerts an inwardly directed radial force on the detenting wheel, slides down the slope of the tooth toward the bottom of the indentation. The force of the detenting member causes the detent wheel to be rapidly accelerated until the biasing member reaches the bottom of the indentation, at which point the detent wheel is rapidly decelerated to zero. The above-mentioned acceleration and deceleration is transmitted through the clutch assembly 40 to the gears 42 and 44 and the rotor shaft 38. Because of the relatively high mass of the rotor shaft 38, the driven plate 48 and the gears 42 and 44, relatively high forces are required to accelerate and decelerate these components at a rate comparable to the acceleration and deceleration of the detent wheel by the detent member. These forces cannot be transmitted by the clutch assembly 40 without minute amounts of slippage. This slippage accumulates after repeated channel changes, and necessitates periodic readjustment of the fine tuning. Tightening the clutch assembly 40 to reduce the slippage causes the fine tuning knob 20 to be difficult to turn and does not substantially reduce the "inertial creep" problem.

Accordingly, according to an important aspect of the present invention, the detent wheel 54 has been designed to minimize the acceleration and deceleration caused by the detenting mechanism. A series of relatively shallow indentations 56 are employed to define the detent positions, and a series of islands 58 each having a relatively flat plateau 60 is disposed between the indentations 56. The surface of each plateau 60 is substantially cylindrical, having a radius extending from the center of the selector shaft 24 to the surface of the plateau 60. Consequently, when the selector shaft 18 is rotated between detent positions, there is no tangential component of force exerted on the detent wheel by the spring 52 that can cause the detent wheel 54 to be accelerated.

In operation, as the selector shaft is rotated from one detent position to another, there is an initial retarding force tending to maintain the detent wheel 54 in its original detent position as the spring 52 is displaced outwardly by a wall of one of the islands 58. After the detent wheel has been rotated sufficiently to bring the spring 52 in contact with the surface of the plateau 60, further incremental rotation of the detent wheel 54 will not cause further deflection of the spring 52 as the spring 52 rides along the plateau 60. This occurs because the plateau 60 has a constant radius extending from the axis of rotation of the detent wheel 54 to the surface of the plateau 60. Consequently, during the time that the spring 52 is travelling along the plateau 60, no accelerating force is exerted on the detent wheel 54 until after the entire plateau 60 has been traversed and the next one of the indentations 56 is approached. This is in contrast with prior art systems utilizing a star wheel in which a large rotary acceleration producing tangential force is initiated immediately after the midpoint between two adjacent indentations is reached. The detent wheel 54 of the present invention generates only a small accelerating force for a relatively short period of time before the spring 52 is seated in the indentation 56, thereby reducing both the duration and the intensity of the accelerating force and substantially reducing "inertial creep". The detenting action provided by the improved detenting wheel does not appreciably effect the tactile feel perceived by the user, because the inertia of the tuning knob, the tuner shaft, and the hand of the user tends to carry the mechanism between indentations. Because of this inertia, the detenting mechanism will not stop between detent positions unless the user deliberately attempts to stop it there.

In the illustrated embodiment, a detenting wheel having outwardly extending islands 58 is employed; however, other configurations are possible for the detenting wheel. For example, a structure similar to a crown gear, having islands extending axially from a face of the detenting wheel may be employed in conjunction with an axially displaceable detenting member. If such a structure is employed, the plateaus should have planar surfaces parallel to the face of the detenting wheel to prevent the detenting spring from being displaced axially as the plateau is traversed. In each case, the exact shape of the plateau must be tailored to be compatible with the modified detenting structure so that substantially no rotary accelerating force is imparted to the detenting wheel as the plateau is traversed by the detenting member.

In accordance with another important feature of the invention, the tuner 10 is provided with many interior refinements for increasing the accuracy with which the tuner may be tuned. As a result of these refinements, the tuner is tuned to ±1 megacycle of the selected frequency at each detent position of the selector shaft. One of these improvements includes the use of rotor plates 62 designed to provide a greater range of rotation for the rotor shaft 38 than has been heretofore provided for use with UHF television tuners. In the present embodiment, a nominal 270°, or more specifically, a 276° range or rotation has been provided for the rotor shaft 38. This provides a 4° range of rotation between each of the television channels in the UHF band (69 spaces between 70 channels times 4° equals 276°). The increased range of rotation improves the accuracy by reducing the amount of capacitance error caused by each degree of rotation error in the position of the rotor shaft 38. Although rotor plates designed to provide a range of rotation of 276° have been illustrated, the 276° range is not crucial to the operation of the system, but is intended to illustrate the fact that any increase in the range of rotation of the rotor shaft 38 will increase the accuracy of the tuner, particularly when the increase permits the use of a less complex gear mechanism.

As a result of the increased rotation of the rotor shaft 38, the reduction ratio of the gears 42 and 44 may be reduced to a nominal 9-to-1 when a selector shaft rotatable over a range of 6.9 revolutions is used. This compares to a nominal 14-to-1 reduction ratio required when a conventional tuner having a 180° range of rotation is used in conjunction with a 6.9 turn selector shaft. This permits the use of only two gears (gears 42 and 44) as the speed reducing drive between the selector shaft and the rotor shaft 38. The use of only two gears reduces the amount of backlash in the gear train, thereby further increasing the accuracy with which the rotor shaft 38 may be set at each position of the selector shaft 18. To further reduce the backlash of the gear train, the gears 42 and 44 are fabricated from a resilient material, such as resilient plastic, and the teeth of one of the gears, in this embodiment the gear 44, are slightly offset with respect to the teeth of the other gear to provide an antibacklash design. Consequently, as a result of the increased range of rotation of the selector shaft 38, a two-gear drive assembly that is as small as a three-gear drive assembly used with 180° range of rotation rotor shaft can be fabricated.

The positioning of the rotor plates 62 with respect to one or more stator plates 64 is extremely critical. Furthermore, the spacing between the rotor and stator plates 62 and 64 must not change with wear or aging if good accuracy is to be maintained. Consequently, the positions of both the stator plates 64 and the rotor shaft 38 must be accurately controlled if the desired ±1 megacycle setting accuracy is to be achieved.

Prior art tuners generally utilize a rotor shaft that has a reduced diameter portion engaging an aperture in the housing of the tuner, and a resilient biasing member for providing an axial force on the rotor shaft to maintain the reduced diameter portion in engagement with the tuner housing. This arrangement provides a rather stable mounting for the rotor shaft, however, it is not entirely satisfactory for the following reasons. In order to provide accurate centering of the rotor shaft, a portion of the reduced diameter end of the rotor shaft is made conical in shape. The aperture in the housing is generally cylindrical in shape. This results in a rather small bearing area at the junction of the conically shaped portion of the rotor shaft and one edge of the aperture. As a result, a large amount of stress occurs at the point of contact between the housing and the rotor shaft, thereby resulting in a large amount of wear at the point of contact. The resultant wear causes an axial displacement of the rotor shaft and a consequent displacement of the tuning rotor during the life of the tuner. As a result, the tuning of the tuner tends to drift with time.

In order to overcome the above-mentioned problem, an eyelet 66 is interposed between the rotor shaft 38 and a rear wall 68 of the tuner housing 70. The eyelet 66 is soldered in place and is fabricated from a material which has good bearing properties and which is softer than the material from which the rotor shaft 38 is fabricated. For example, in the embodiment illustrated, the eyelet 66 may be fabricated from brass and the shaft 38 from steel.

The eyelet 66 has a sleeve portion 72 adapted to fit into an aperture 76 in the wall 68 and adapted to receive a cylindrical portion 78 of the reduced diameter end of the rotor shaft 38. In addition, the eyelet 66 has a funnel shaped flange portion 74 adapted to receive a conically shaped portion 80 of the reduced diameter end portion of the rotor shaft 38. The slopes of the funnel shaped flange and the conically shaped section 80 are made substantially similar to thereby increase the bearing surface and reduce the wear on the eyelet 66 and the shaft 38. It has been found that ordinary brass eyelets of the type used in the fabrication of printed circuit boards are suitable for use as the eyelet 66, thereby providing an extremely economical bearing for the shaft 38.

UHF television tuners generally employ a resilient biasing member such as a spring 82 and possibly a second biasing member such as the spring 84 for grounding the rotor shaft 38 and for maintaining the end of the rotor shaft 38 in engagement with the wall 68 of the housing. Such a biasing member is employed whether or not an eyelet, such as the eyelet 66 is used. The biasing pressure exerted by the biasing member can cause the position of the wall 68 to shift over a period of time, thereby permitting the rotor shaft 38 to shift axially and detune the tuner 10.

Figure 3:
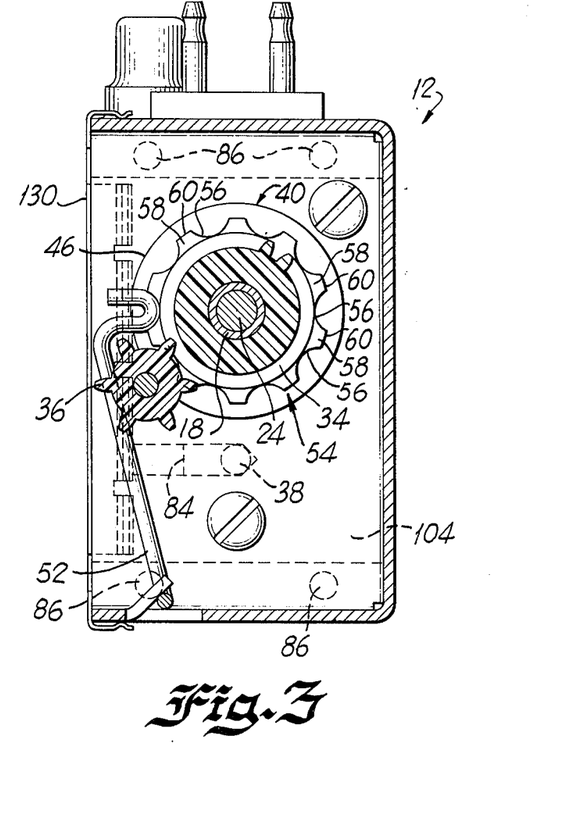
FIG. 3 is a front sectional view taken along line 3—3 of FIG. 1.
Figure 4:
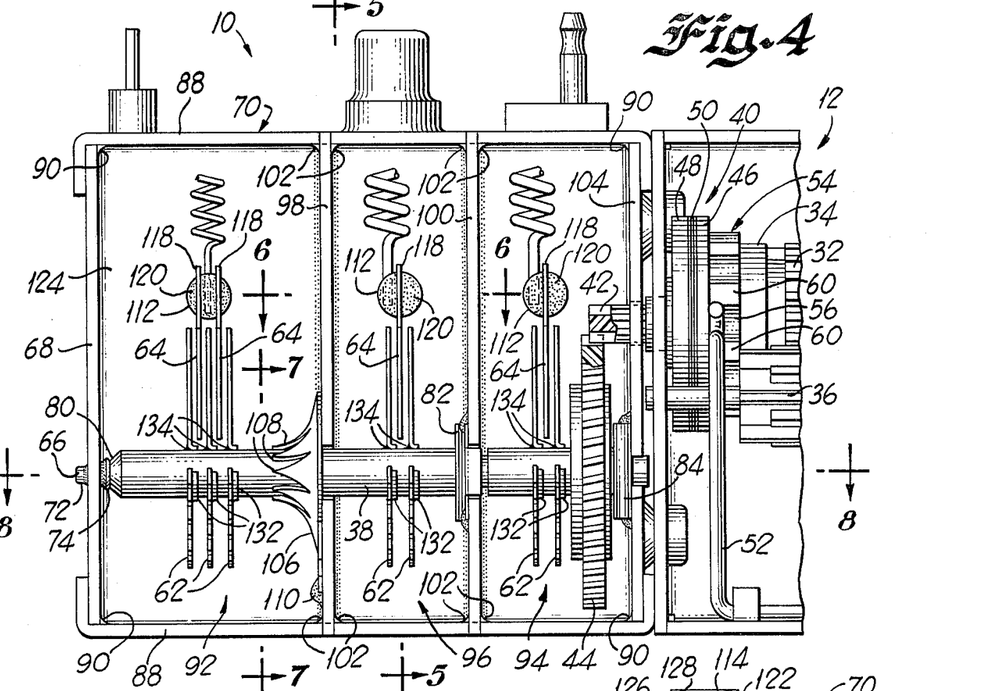
FIG. 4 is a side view of the tuner section of the tuning system illustrated in FIG. 1, with the tuner cover removed to show the interior components of the tuner.
Figure 5:
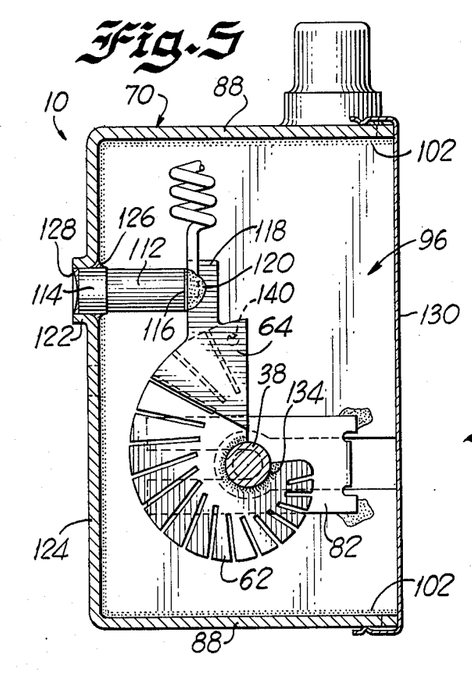
FIG. 5 is a rear sectional view of the tuner taken along line 5—5 of FIG. 4.
Figure 6:
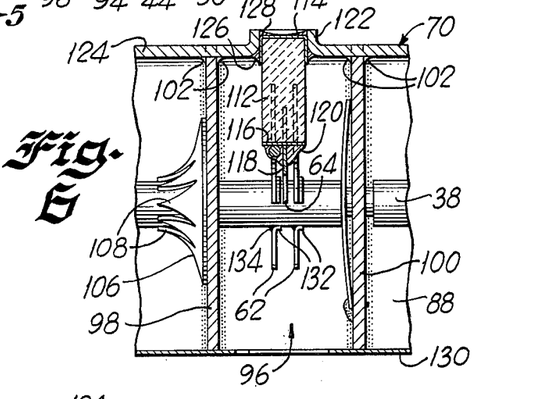
FIG. 6 is a partial top sectional view of the tuner taken along line 6—6 of FIG. 4.
Figure 7:
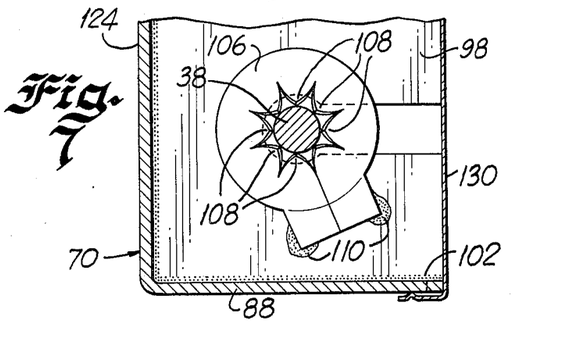
FIG. 7 is a partial rear sectional view taken along line 7—7 of FIG. 4.
Figure 8:
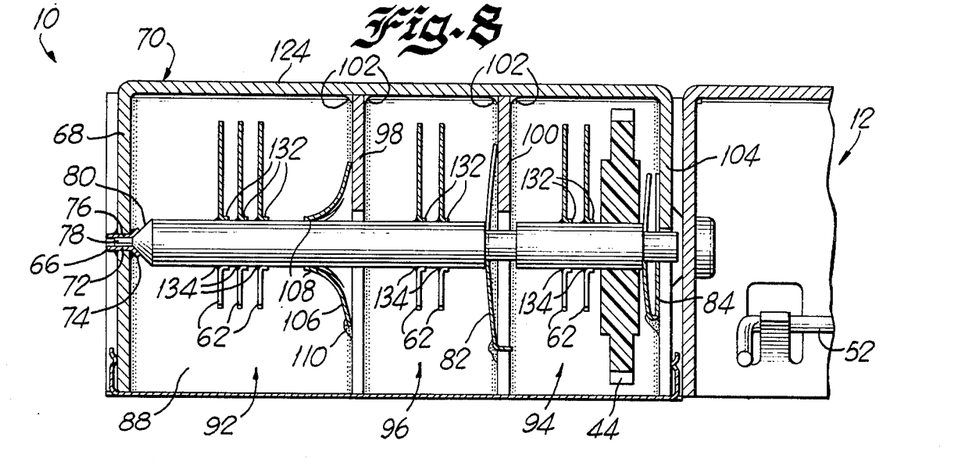
FIG. 8 is a top sectional view taken along line 8—8 of FIG. 4.
Figure 9:
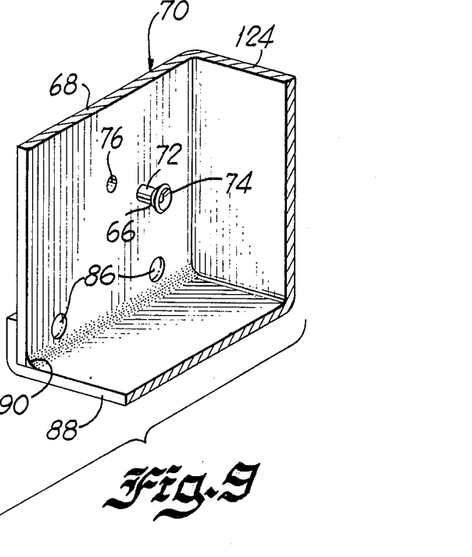
FIG. 9 is a partial exploded perspective view of the tuner showing the construction of one of the corners of the tuner housing.

It has been found that the shift in the position of the wall 68 is caused by insufficient rigidity at the points where the wall 68 is supported by the adjacent walls 88. Present tuners are swaged and soldered at the corners, and it is believed that the biasing pressure causes the solder to deform, thereby permitting the swaged joint to shift slightly. This shift can be an appreciable detuning factor in a highly accurate tuner. Consequently, in accordance with an important feature of the invention, the wall 68 has been spot welded at areas designated as 86 (FIGS. 3 and 9) to a pair of adjacent walls 88 to increase the mechanical rigidity of the corners. The walls 68 and 88 are also soldered together at areas designated as 90 to provide a better electrical conductivity between the walls than could be achieved by spot welding alone. This technique provides a structure that is extremely stable both mechanically and electrically, particularly when one of the walls is bent around and overlays the other wall as shown in FIGS. 1, 4, 8 and 9.

The tuner 10 is divided into three basic sections; an oscillator section 92, an antenna input section 94 and an intermediate frequency output section 96, which usually contains a mixer. These three sections are separated by a pair of electrically conductive partitions 98 and 100 which serve to isolate the three sections 92, 94 and 96. The partitions 98 and 100 are soldered to the walls 88 at points 102 to provide a good electrical connection between the walls 88 and the partitions 98 and 100. To provide further isolation between the sections, the resilient biasing member that exerts axial pressure on the rotor shaft 38 also is soldered to the partition 100 to ground the shaft 38 to the partition 100. The resilient biasing member 84 serves to ground the shaft 38 to a wall 104. The wall 104 supports the shaft 38 and is spot welded and soldered to extensions of the walls 88.

When a highly accurate tuning system is desired, an improved system for grounding the shaft to the wall 98 of the oscillator section 92 must be provided. A generally circular grounding spring 106 (FIGS. 4, 6 and 7) is used to provide the necessary grounding of the shaft 38 to the wall 98. The spring 106 has a central aperture for receiving the shaft 38, and a plurality of contact members 108 extending radially into the aperture. The tips of the spring members 108 define a circle having a diameter smaller than the diameter of the shaft 38, and serve to provide electrical contact around the entire periphery of the shaft 38. The contact spring 106 is fabricated from a resilient conductive material to permit the contact members 108 to be deflected by the shaft 38 when the shaft 38 is inserted into the aperture. After insertion has been accomplished, the contact members 108 exert a resilient biasing force against the shaft 38 to assure a good contact between the contact spring 106 and the shaft 38. The contact spring 106 is soldered to the partition 98 at an area 110 to assure good electrical contact between the partition 110 and the spring member 106.

In a highly accurate tuner, it is important for the stator plates 64 to be accurately positioned with respect to the rotor plates 62, and for the stator plates 64 not to shift with time and ambient conditions. The position of the stator plates 64 is particularly critical in the oscillator section 92 of the tuner 10. In accordance with another important aspect of the invention, an improved system has been developed for mounting the stator plates 64. A ceramic post 112 having a pair of metallized areas 114 and 116 is employed to support the stator plates 64. Each of the stator plates 64 has a mounting tab 118 extending therefrom that is soldered at an area 120 to the metallized portion 116 at the end of the ceramic post 112. The post 112 is inserted through a sleeve portion 122 formed in a bottom wall 124 of the housing 70. The metallized area 114 is soldered to the wall 124 and the sleeve portion 122 at areas 126 and 128, respectively. The use of the sleeve 122 permits the post 112 to be moved into and out of the housing to adjust for manufacturing tolerances, and provides lateral support for the post 112. The use of the sleeve 122 assures a better mechanical connection between the post 112 and the mounting tab 118 by permitting the post 112 to be brought into contact with the tab 118, and provides a better mechanical connection to the wall 124 by increasing the contact surface between the posts 112 and the wall 124. This provides a much more stable structure than can be achieved by the prior art technique of filling with solder any gaps that occur between the post 112 and the wall 124 or the tab 118 as a result of component variations. This is because solder is mechanically unstable, and results in a mechanically unstable structure when used in large quantities to fill gaps in the structure. The technique according to the invention minimizes the amount of solder used, and provides mechanical support in addition to that provided by the solder.

In order to further increase the rigidity of the housing 70, a cover 130 (FIGS. 1 and 2) is placed over the opening in the housing 70 and soldered to the walls of the housing 70 at the four corners at areas 132. The soldering of the cover 130 to the housing 70 serves the dual function of increasing the rigidity of the entire tuner assembly and improving the electrical connection between the cover 130 and the housing 70. In order to reduce the electrical interaction between the electrical components within the tuner and the cover 130, the depth of the housing 70 is increased to increase the spacing between the tuner components and the cover 130. This permits the tuner 10 to be aligned by bending the rotor plates 62 with the cover removed, and permits the cover to be attached to the housing after alignment without substantially affecting the tuning. Increasing the depth of the tuner from the nominal 1 inch normally found in UHF tuners to a nominal 1.25 inches reduces the effect of the cover on the tuning of the tuner, and permits the tuner to be tuned to the desired ±1 megacycle accuracy.

In accordance with another important aspect of the invention, the rotor plates 62 are affixed to the rotor shaft 38 without the use of retaining grooves on the rotor shaft 38. Consequently, the plates 62 may be spaced anywhere along the rotor shaft 38, and the spacing between the various ones of the rotor plates 62 and the relative spacing between the rotor plates 62 and the stator plates 64 is not affected by the position of the retaining grooves on the rotor shaft 38, or by the axial position of the shaft 38 with respect to the housing 70, as in the prior art systems.

Figure 10:
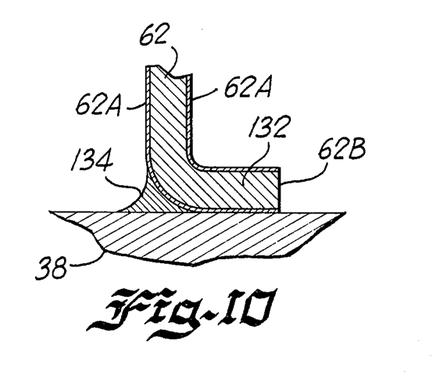
FIG. 10 is a detailed cross sectional view of the tuner rotor showing the method of affixing the rotor plates to the rotor shaft.
Figure 11:
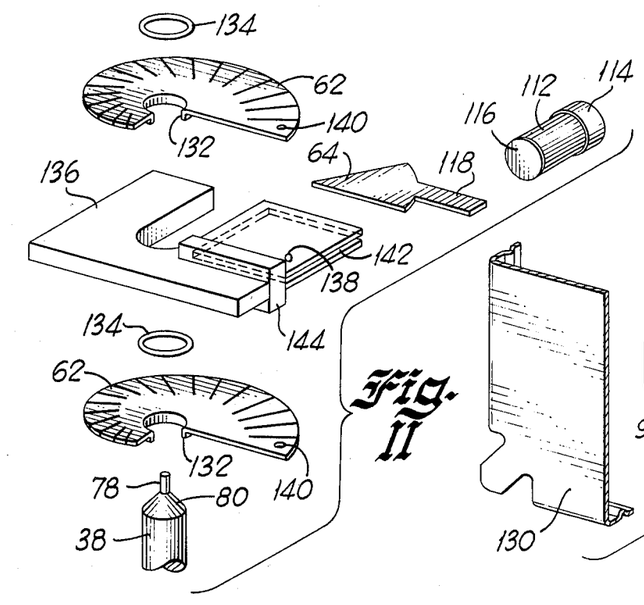
FIG. 11 is an exploded assembly view showing the method of assembling the rotor shaft illustrated in FIGS. 4-8.
Figure 12:
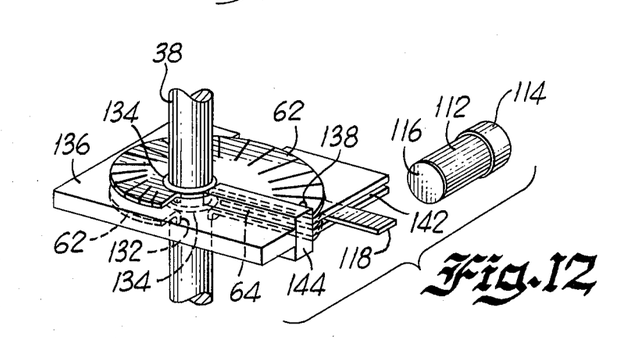
FIG. 12 is a perspective view showing the assembly illustrated in FIG. 11 prior to insertion into the tuner housing.

In the embodiment illustrated, the rotor plates 62 are attached to the rotor shaft 38 by a new and improved assembly process illustrated in FIGS. 11 and 12. A sleeve 132 is integrally formed with each of the rotor plates 62. The sleeve 132 serves to support the rotor plates 62 in a substantially perpendicular relationship to the shaft 38 and provides an increased surface area to which a solder connection may be made. The latter feature is particularly useful when the rotor plates 62 are fabricated from a material such as tin plated sheet steel because the use of a sleeve 132 permits a solder connection to be made to a tin plated surface 62A (FIG. 10) rather than to the steel edge 62B of the rotor plate 62. A typical assembly sequence is as follows. First, one of the rotor plates 62 is placed over the rotor shaft 38. A ring of solder 134 is then placed over the shaft 38 adjacent to the rotor plate 62. A spacer 136 is then placed over the rotor plate 62 and a second rotor plate 62 is placed over the spacer 136 followed by a second ring of solder 134. The spacer 136 has a centering pin 138 suitable for engaging a centering hole 140 in each of the rotor plates 62. A slot 142 is provided in the spacer 136 to receive one of the stator plates 64 for the purpose of retaining the stator plate 64 between the rotor plates 62. The spacer 136 may be fabricated from magnetic material in order to retain the rotor and stator plates in position during the assembly process, or a magnet 144 may be inserted into the spacer to retain the rotor and stator plates in place, provided that the rotor and stator plates are fabricated from a magnetic material. Alternatively, the rotor and stator assembly may be held together by means of a clamp or a spring assembly. Also separate spacers may be used between each of the rotor plates 62 and the stator plate 64 instead of the single slotted spacer 136 if it is more convenient to do so for any reason.

Once the rotor and stator assembly has been assembled, as shown in FIG. 12, the entire assembly is heated to cause the solder rings 134 to melt and to solder the stator plates 62 to the rotor shaft 38. The heating can be done by placing the entire assembly in an oven, or by induction heating.

Subsequent to the heating, the entire assembly is installed in the housing 70 by placing the eyelet 66 over the reduced diameter portion 78 of the rotor shaft 38, and securing the rotor shaft in place with the biasing springs 82, 84 and the spring contact 106. The eyelet 66 is then soldered in place, and the respective ceramic posts 112 are inserted through the proper sleeves 122 and soldered in place at both ends. As a result, a very accurate assembly is produced, with the spacing between the rotor and stator plates being directly determined by highly accurate spacers, thereby eliminating the buildup of component tolerances that can cause inaccuracies in the prior art systems.

While certain preferred embodiments of the invention have been described by way of illustration, many modifications will occur to those skilled in the art; it will be understood, of course, that it is not desired that the invention be limited thereto, since modifications may be made, and it is, therefore, contemplated by the appended claims to cover any such modifications as fall within the true scope and spirit of the invention.

What is claimed as new and desired to be secured by Letters Patent of the United States is:

1. The combination of, a UHF tuner having a plurality of groups of tuning elements connected to a common rotatable main tuning shaft, said rotatable main tuning shaft being rotatable over a range of approximately 270° to effect selective reception of all television stations in the UHF television band, a control shaft, gear means interconnecting said control shaft and said main tuning shaft, detent means for said control shaft to establish a stop position of said main tuning shaft for each of the seventy television stations in the UHF band, dial indicator means connected to said control shaft and arranged to provide an exact digital indication of the UHF channel number corresponding to one of said stop positions of said main tuning shaft, said tuning elements of said UHF tuner being aligned to receive the corresponding UHF station at each of said stop positions of said main tuning shaft with a maximum error of approximately one megacycle, whereby the channel indicated by said dial indicator means is nonambiguous, said maximum error of approximately one megacycle being maintained when said combination is fabricated on a production line.

2. The combination recited in claim 1 wherein said gear means has only two gears, a first gear connected to said control shaft and a second gear connected to said main tuning shaft.

3. The combination recited in claim 2 wherein said gears are selected to provide a speed reduction ratio of approximately 9-to-1.

4. The combination of, a UHF tuner having a plurality of groups of tuning elements connected to a common rotatable main tuning shaft, a control shaft, gear means interconnecting said control shaft and said main tuning shaft, detent means for said control shaft to establish a stop position of said main tuning shaft for each of the television channels in the UHF band, dial indicator means connected to said control shaft and arranged to provide an indication of the UHF channel number corresponding to one of said stop positions of said main tuning shaft, said tuning elements of said UHF tuner being aligned to receive the corresponding UHF station at each of said stop positions of said main tuning shaft, wherein said main tuning shaft has a conically shaped reduced diameter end section, said UHF tuner having a housing having an aperture defined therein and an eyelet inserted in said aperture, said eyelet having a conically shaped portion disposed adjacent to the reduced diameter end section of said main tuning shaft for receiving said reduced diameter end section therein for rotatably supporting said main tuning shaft within said housing.

5. The combination of, a UHF tuner having a plurality of groups of tuning elements connected to a common rotatable main tuning shaft, a control shaft, gear means interconnecting said control shaft and said main tuning shaft, detent means for said control shaft to establish a stop position of said main tuning shaft for each of the television channels in the UHF band, dial indicator means connected to said control shaft and arranged to provide an indication of the UHF channel number corresponding to one of said stop positions of said main tuning shaft, said tuning elements of said UHF tuner being aligned to receive the corresponding UHF station at each of said stop positions of said main tuning shaft, wherein said main tuning shaft has a reduced diameter end section, said UHF tuner having a housing having an aperture defined therein and an eyelet inserted in said aperture, said eyelet being disposed adjacent to the reduced diameter end of said main tuning shaft for receiving said reduced diameter portion therein for rotatably supporting said main tuning shaft within said housing, wherein said main tuning shaft is fabricated from a metal, and said eyelet is fabricated from a different metal softer than the metal from which the main tuning shaft is fabricated.

6. The combination recited in claim 5 wherein said main tuning shaft is fabricated from steel and said eyelet is fabricated from brass.

7. The combination recited in claim 6 wherein said eyelet is soldered to said housing.

8. The combination of, a UHF tuner having a plurality of groups of tuning elements connected to a common rotatable main tuning shaft, a control shaft, gear means interconnecting said control shaft and said main tuning shaft, detent means for said control shaft to establish a stop position of said main tuning shaft for each of the television channels in the UHF band, dial indicator means connected to said control shaft and arranged to provide an indication of the UHF channel number corresponding to one of said stop positions of said main tuning shaft, said tuning elements of said UHF tuner being aligned to receive the corresponding UHF station at each of said stop positions of said main tuning shaft, said tuning elements including a plurality of capacitor plates including rotor plates affixed to said main tuning shaft and a stator plate disposed adjacent to one of said rotor plates and a supporting member affixed to said stator plate, wherein said housing has a sleeve portion formed therein for receiving and supporting said supporting member.

9. The combination recited in claim 8 wherein said rotor plates are soldered to said main tuning shaft.

10. The combination recited in claim 9 wherein each of said rotor plates has a sleeve portion formed therein for receiving said main tuning shaft.

11. The combination recited in claim 8 wherein said supporting member is metallized over a predetermined area thereof, and wherein said stator plate is soldered to a metallized area at one end of said supporting member and said housing is soldered to said supporting member at a metallized portion at the other end of said supporting member.

12. The combination of, a UHF tuner having a plurality of groups of tuning elements connected to a common rotatable main tuning shaft, a control shaft, gear means interconnecting said control shaft and said main tuning shaft, detent means for said control shaft to establish a stop position of said main tuning shaft for each of the television channels in the UHF band, digital indicator means connected to said control shaft and arranged to provide an indication of the UHF channel number corresponding to one of said stop positions of said main tuning shaft, said tuning elements of said UHF tuner being aligned to receive the corresponding UHF station at each of said stop positions of said main tuning shaft, wherein said UHF tuner includes a housing fabricated from a sheet of metal having portions thereof bent to form a box structure, at least one edge of the box structure being formed by spot welding and soldering two bent portions of the metal sheet together.

13. The combination recited in claim 12 wherein said box structure has an opening therein, and a cover disposed over the opening and affixed to the housing by soldering at the corners thereof.

14. The combination of, a UHF tuner having a plurality of groups of tuning elements connected to a common rotatable main tuning shaft, a control shaft, gear means interconnecting said control shaft and said main tuning shaft, detent means for said control shaft to establish a stop position of said main tuning shaft for each of the television channels in the UHF band, digital indicator means connected to said control shaft and arranged to provide an indication of the UHF channel number corresponding to one of said stop positions of said main tuning shaft, said tuning elements of said UHF tuner being aligned to receive the corresponding UHF station at each of said stop positions of said main tuning shaft, wherein said UHF tuner includes an electrically conductive housing, and a contact member having an aperture defined therein and a plurality of finger members extending radially into the aperture, said contact member being electrically and mechanically connected to said housing with said main tuning shaft passing through said aperture engaging said finger members, and making electrical contact therewith.

15. The combination recited in claim 14 wherein said finger members are deflectable by said main tuning shaft.

16. The combination of, a UHF tuner having a plurality of groups of tuning elements connected to a common rotatable main tuning shaft, a control shaft, gear means interconnecting said control shaft and said main tuning shaft, detent means for said control shaft to establish a stop position of said main tuning shaft for each of the television channels in the UHF band, dial indicator means connected to said control shaft and arranged to provide an indication of the UHF channel number corresponding to one of said stop positions of said main tuning shaft, said tuning elements of said UHF tuner being aligned to receive the corresponding UHF station at each of said stop positions of said main tuning shaft, wherein said detent means includes a detent wheel having indentations along the periphery thereof and islands separating the indentations, and a resiliently biased member engaging the indentations of said wheel as the selector shaft is rotated, thereby to establish equally spaced detent positions for said control shaft, said detent wheel including means for controlling the acceleration of said detent wheel as the selector shaft is rotated from one detent position to another, said acceleration controlling means including a plateau disposed on each of said islands in the region between adjacent indentations, each plateau being shaped so that said resiliently biased member exerts substantially no rotational force on said detent wheel when said resiliently biased member is in contact with any one of said plateaus.

17. The combination recited in claim 16 wherein said detent wheel is rotatably about a predetermined axis of rotation and each of said islands extends radially from said detent wheel, and wherein each of said plateaus has a cylindrically-shaped surface fabricated with a substantially constant radius between the axis of rotation of said detent wheel and the surface of each plateau, whereby said resiliently biased member is deflected a substantially constant amount by each of said cylindrical surfaces.

18. The combination recited in claim 17 wherein said detent wheel is affixed to said control shaft for rotation therewith.

* * * * *